United States Patent [19]

Nakamura et al.

[11] Patent Number: 4,675,884
[45] Date of Patent: Jun. 23, 1987

[54] DECODING CIRCUIT

[75] Inventors: Kazunori Nakamura, Hadano; Mitsuhiro Yamaga, Kawasaki; Ryozo Yoshino, Hadano; Norihiko Sugimoto, Katsuta, all of Japan

[73] Assignees: Hitachi, Ltd.; Hitachi Microcomputer Engineering Ltd., both of Tokyo, Japan

[21] Appl. No.: 812,921

[22] Filed: Dec. 23, 1985

[30] Foreign Application Priority Data

Dec. 27, 1984 [JP] Japan ................................ 59-273595

[51] Int. Cl.⁴ ............................................. H04L 27/22
[52] U.S. Cl. ....................................... 375/87; 375/84; 375/94; 329/104; 360/42; 360/48
[58] Field of Search ........................ 375/87, 84, 94, 95, 375/83, 85, 86; 329/104; 360/40, 42, 44, 48

[56] References Cited

U.S. PATENT DOCUMENTS 4,575,684   3/1986   Stamm ................................ 375/84

OTHER PUBLICATIONS

*Draft IEEE Standard* 802.5 by IEEE Project 802; "Token Ring Access Method & Physical Layer Specifications"; Working Draft; 12/1/83.

*Primary Examiner*—Robert L. Griffin
*Assistant Examiner*—M. Huseman
*Attorney, Agent, or Firm*—Antonelli, Terry & Wands

[57] ABSTRACT

A decoding circuit is operative to decode a differential Manchester code consisting of four symbols "J", "K", "1" and "0" each composed of two consecutive signal elements. For detection of the symbol "J" and consequent determination of the symbol boundary, the decoding circuit has a circuit configuration which takes advantage of the fact that the symbol "K" immediately follows the symbol "J" and three consecutive signal elements, two of which are included in the symbol "J" and one of which is for a symbol immediately preceding the symbol "J", have the same polarity. To prevent an error that a second occurrence of the symbol "J" is detected after completion of detection of the symbol "J", the decoding circuit has an additional circuit configuration which inhibits the detection of the symbol "J" until the symbol "0" or the symbol "1", for example, is detected.

5 Claims, 3 Drawing Figures

F I G. 3
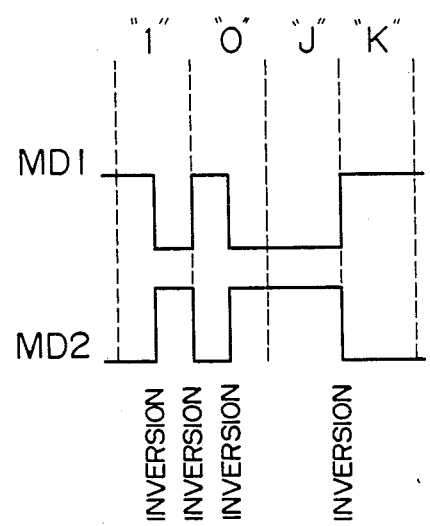

DECODING CIRCUIT

BACKGROUND OF THE INVENTION

This invention generally relates to decoding circuits and more particularly to a decoding circuit suitable for a differential Manchester code.

Conventionally, the type of code for data transmission has been studied by paying attention to how much binary logical values "1" and "0" can be transmitted and received correctly. However, as communication systems such as local area networks have advanced and consequently, increasing demands for information transfer in the form of packet have arisen, a code has been sought which can be adapted for transmission of ternary and quaternary data instead of the conventional binary data. Such a code is typically exemplified by the differential Manchester code. Details of the differential Manchester code are discussed in *Draft-IEEE Standard 802.5* by IEEE PROJECT 802 entitled "Token Ring Access Method and Physical Layer Specifications", Working Draft, Dec. 1, 1983.

According to this publication, the differential Manchester code has quaternary symbols of "1", "0", "J" and "K" which are coded by using two signal elements for each symbol. To be specific, the symbol "1" does not make an inversion at the boundary of that symbol but makes an inversion in the middle of that symbol. The symbol "0" makes inversions at the boundary of and in the middle of that symbol. The symbol "J" makes no inversion at the boundary and in the middle of that symbol. The symbol "K" makes an inversion at the boundary of that symbol, but does not make an inversion in the middle of that symbol. Accordingly, the coding rule of the differential Manchester code is based on whether transition (inversion) of the polarity takes place at the boundary between the signal elements.

As will be seen from the above explanation, (1) The symbols "0" and "1" make a transition in the middle of those symbols; and (2) The symbols "0" and "K" make a transition at the boundary adjacent the preceding symbol.

Therefore, detection of the symbol boundary is indispensable for decoding the differential Manchester code. However, this type of code does not involve a sole specified pattern suitable for the detection of the symbol boundary. Therefore, in a decoding circuit of the differential Manchester code, a method has been available which uses combinations of a plurality of symbols for the detection of the symbol boundary in accordance with a protocol of data transmission for which the differential Manchester code is used. According to a protocol described in the above-mentioned Working Draft by IEEE PROJECT 802, for example, a frame and a token start from consecutive symbols of "J, K, 0, J, K, 0, 0, 0" (hereinafter referred to as starting delimiter "SD") and terminate in consecutive symbols of "J, K, 1, J, K, 1" (hereinafter referred to as ending delimiter "ED"). Information to be transmitted is inserted between SD and ED. The conventionally known decoding circuit follows the aforementioned protocol and uses specified patterns (SD and ED) prescribed by this protocol for detecting and decoding the symbol boundary, thus facing problems as below.

(1) The decoding circuit must be re-designed according to protocols prescribing different SDs, EDs and other special patterns.

(2) Delay time in the decoding circuit is large.

(3) Amounts of hardwave required for the decoding circuit are large.

SUMMARY OF THE INVENTION

An object of this invention is to provide a decoding circuit which is available without depending on any protocol.

Another object of this invention is to provide a decoding circuit which can speed up decoding processing.

Still another object of this invention is to provide a decoding circuit configured with a minimized amounts of hardwave.

The present invention is based on the following principle.

(1) Three consecutive signal elements have the identical polarity only for either the symbol "J" or the consecutive symbols "K" and "1" (simply referred to as "(K+1) symbol" or "K+1" as the latter case).

(2) To warrant the mark rate, the symbols "J" and "K" are necessarily used in pair.

Accordingly, the symbol "J" is detected and its symbol boundary is determined by using the fact that the three consecutive signal elements have the same polarity for the symbol "J". Once the symbol "J" has been detected, the detection of symbol "J" is inhibited until detection of a predetermined symbol, for example, the symbol "0" or "1", in order to prevent such an error that the consecutive symbols "K" and "1" or the (K+1) symbol immediately succeeding the symbol "J" is detected as a second occurrence of the symbol "J".

According to one feature of the invention, a decoding circuit for the differential Manchester code consisting of four symbols "J", "K", "1" and "0" each composed of two signal elements comprises the following first, second and third means:

(a) First means receives a sequence of input signal elements of the differential Manchester code and detects whether an inversion occurs at the boundary between the signal elements. As a result, first, second and third boundary signals concerning consecutive boundaries of three out of four consecutive signal elements are produced by the first means. The first means also detects that boundary signals concerning consecutive boundaries of four out of five consecutive signal elements are represented by "inverted, non-inverted, non-inverted, inverted" whose signal sequence is indicative of a symbol "J" and produces a "J" detection signal.

(b) Second means is responsive to the J detection signal produced from the first means to inhibit the delivery of the J detection signal from the first means until a predetermined symbol (for example, a symbol "1" or "0") is detected as decoded successfully.

(c) Third means is responsive to the J detection signal produced from the first means to eliminate either the first boundary signal or the third boundary signal from the first to third boundary signals produced from the first means and delivers the remaining two boundary signals as decoded signals. Of the first and third boundary signals, selected is the one which arises in coincidence with the time when the symbol "J" is due to be decoded. Thus, the boundary of the symbol "J" is determined and the subsequent symbol sequence can be decoded on the basis of correct boundaries of the symbols.

BRIEF DESCRIPTION OF THE DRAWINGS

FIG. 3 shows waveforms illustrative of the differential Manchester code.

DESCRIPTION OF THE PREFERRED EMBODIMENT

The present invention will now be described by way of example with reference to the accompanying drawings.

FIG. 3 shows signal waveforms indicative of symbols of a differential Manchester code format described previously. This code format may take either a first signal waveform of mode 1 (MD 1) or a second signal waveform of mode 2 (MD 2).

Figure 1:
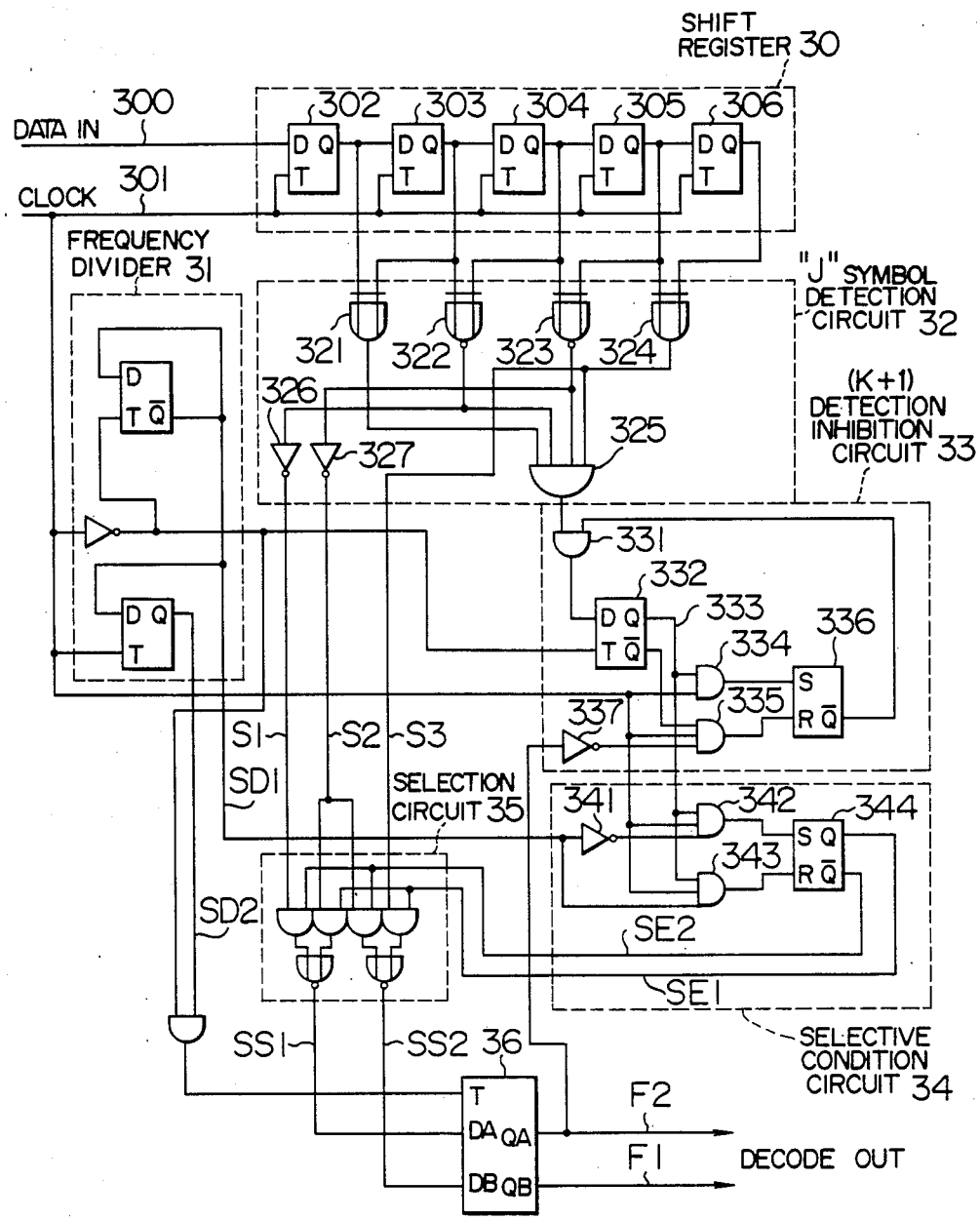
FIG. 1 is a circuit diagram showing one embodiment of the present invention.

FIG. 1 is a circuit diagram showing a preferred embodiment of the present invention. Referring to FIG. 1, a signal 300 of signal elements representative of a differential Manchester code and a shift clock 301 are inputted to a 5-bit shift register 30. The shift register 30 comprises five flip-flop stages 302 to 306 output signals of which are inputted to a J symbol detection circuit 32. The J symbol detection circuit 32 recognizes reception of a symbol "J" when logical values of the output signals of the flip-flop stages 302 to 306 included in the shift register 30 are represented by either "1, 0, 0, 0, 1" or "0, 1, 1, 1, 0" and its AND gate 325 delivers out a logical value "1" as a J detection signal. More particularly, an exclusive OR gate 324 of the J symbol detection circuit 32 produces a logical value "1" as a boundary value signal when logical values of the output signals of the flip-flop stages 305 and 306 are different from each other to indicate that an inversion occurs in the signal 300 of signal elements. Likewise, an exclusive OR gate 321 also produces a logical value "1" as a boundary value signal when logical values of the output signals of the flip-flop stages 302 and 303 are different, indicating that an inversion occurs in the signal 300. An exclusive OR gate 322 produces a logical value "1" as a boundary value signal when logical values of the output signals of the flip-flop stages 303 and 304 are identical to each other, indicating that no inversion occurs in the signal 300. Likewise, an exclusive OR gate 323 also produces a logical value "1" as a boundary value signal when logical values of the output signals of the flip-flop stages 304 and 305 are identical, indicating that no inversion occurs in the signal 300. Accordingly, the AND gate 325 produces the logical value "1" as the J detection signal when a signal 300 of signal elements indicative of a symbol "J" by having a pattern of "inverted, non-inverted, non-inverted, inverted" in the form of either "1, 0, 0, 0, 1" or "0, 1, 1, 1, 0" is inputted to the shift register 30.

Figure 2:
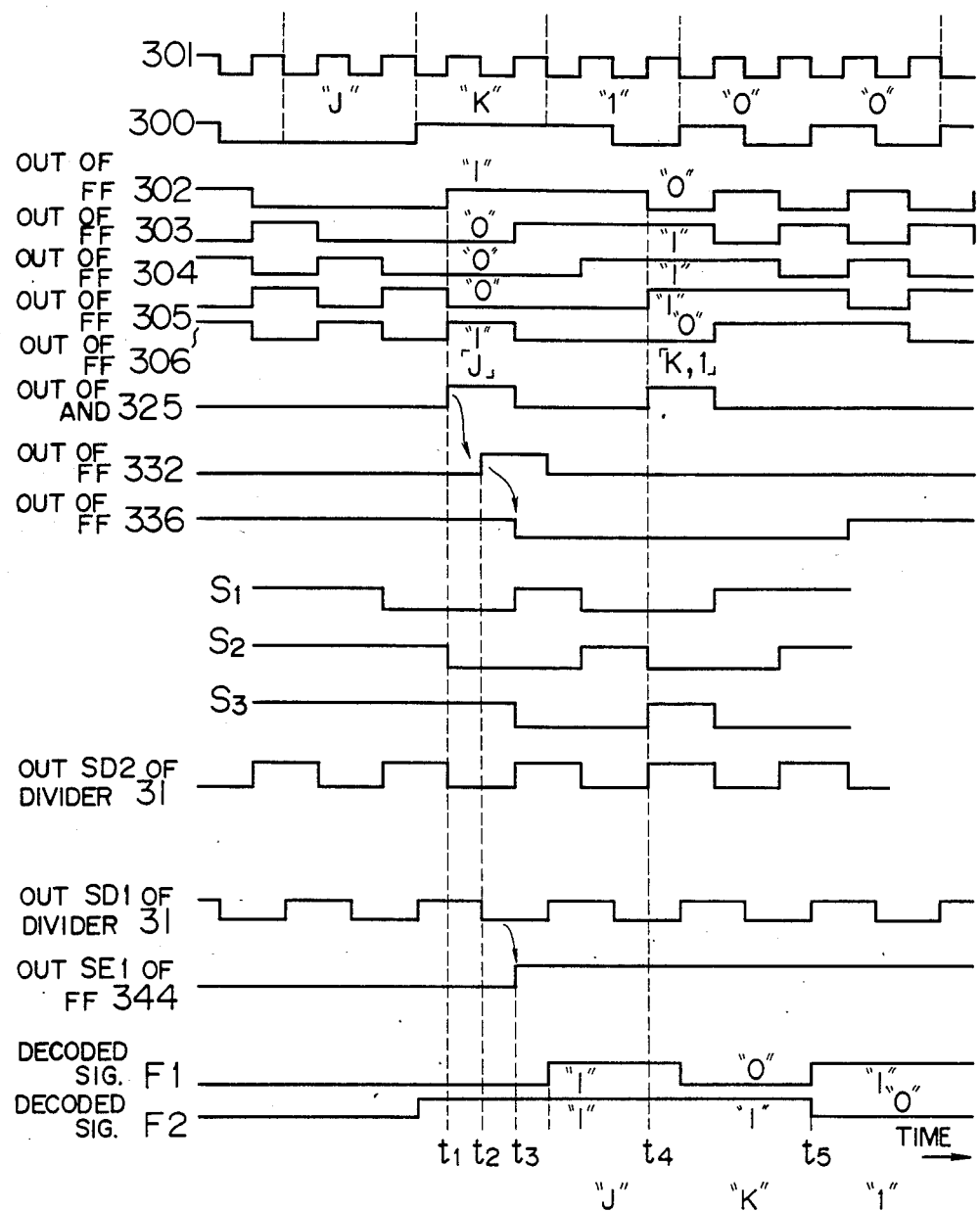
FIG. 2 is a time chart for explaining the operation of the embodiment shown in FIG. 1.

When a signal 300 represented by "J, K, 1, 0, 0" is inputted to the shift register 30 as shown in FIG. 2, logical values of the output signals of the flip-flop stages 302 to 306 at a time $t_1$ are represented by "1, 0, 0, 0, 1" so that the AND gate 325 produces the logical value "1".

Subsequently, the logical value "1" outputted from the AND gate 325 is applied to a (K+1) detection inhibition circuit 33 in which that logical value "1" is inputted to a flip-flop 332 via an AND gate 331. The flip-flop 332 fetches, in timed relationship to reception of an inversion of the shift clock 301, the logical value "1" delivered out of the AND gate 331 and produces, at its output terminals Q and $\overline{Q}$, logical values "1" and "0", respectively the former (333) of which is connected to the set terminal of a flip-flop 336 via an AND gate 334. This permits the flip-flop 336 to produce, from its output terminal $\overline{Q}$, a logical value "0", thereby disabling the AND gate 331 at a time $t_3$ shown in FIG. 2. Consequently, once the symbol "J" has been detected, detection of a signal of signal elements (K+1) which is equivalent to the symbol "J" can be inhibited even when the signal (K+1) is inputted to the shift register 30.

As shown in FIG. 2, following the symbol "J", symbols "K" and "1" are inputted to cause the flip-flop stages 302 to 306 to produce the output signals of logical values represented by "0, 1, 1, 1, 0" at a time $t_4$, enabling the AND gate 325 to produce the logical value "1". This logical value "1" is however inhibited by the AND gate 331.

In the J symbol detection circuit 32, on the other hand, the output signals of the exclusive OR gates 322 and 323 are inverted by inverters 326 and 327 to provide new boundary value signals S1 and S2 which in turn are applied to a selection circuit 35 while the output signal of the exclusive OR gate 324 is applied as a boundary value signal S3 directly to the selection circuit 35. The boundary value signals S1 to S3 are used to indicate whether the inversion associated with logical values "1" and "0" takes place at the boundary in the signal 300.

The selection circuit 35 selectively delivers either a set of boundary value signals S1 and S2 or a set of boundary value signals S2 and S3 derived from the three boundary value signals S1, S2 and S3. This selection is effected by selection signals SE1 and SE2 delivered out of a selective condition generating circuit 34. More particularly, the selective condition generating circuit 34 receives the output signal 333 from the output terminal Q of the flip-flop 332, the shift clock 301 and an output signal SD1 from a frequency divider 31 so as to make either one of the selection signals SE1 and SE2 to the selection circuit 35 a logical value "1". The frequency divider 31 is operative to ½ frequency divide the shift clock 301, as shown in FIG. 2, providing the frequency divided output signal SD1 which in turn is applied to one input of an AND gate 342 via an inverter 341 and directly to one input of an AND gate 343. Accordingly, in accordance with the content of the output signal SD1, either one of the AND gates 342 and 343 is enabled.

In the example of FIG. 2, since the output signal SD1 becomes a logical value "0" at a time $t_2$, the AND gate 342 is then enabled, producing the logical value "1". This logical value "1" sets a flip-flop 344, thereby causing it to produce from its output terminal Q the selection signal SE1 of logical value "1" at the time $t_3$. In this case, the selection circuit 35 therefore selects the set of boundary value signals S2 and S3 and delivers output signals SS1 and SS2.

The selection of the boundary value signals S1, S2 and S3 by means of the selection circuit 35 is required to ensure that a decoding processing (preceding processing) of a signal 300 inputted to the shift register 30 prior to the detection of the symbol "J" can match a decoding processing (current processing) of a signal 300 after the detection of the symbol "J" to thereby prevent displacement of the symbol boundary when decoding. To detail this by referring to FIG. 2, for example, it will be stated that prior to the detection of the symbol "J", the boundary value signals S1 and S2 are selected to effect a decoding processing but this decoding processing is not a processing based on the detection of a correct symbol boundary. In contrast, the detection of the symbol "J" effective to detect the symbol boundary and to select the boundary value signals S2 and S3, followed by a correct decoding processing based on the symbol boundary. As gathered from FIG. 2, when the output signal of the flip-flop 332 standing for the J detection signal does not coincide with the output signal SD1, the boundary value signals S2 and S3 are selected but when both the output signals are coincident, the boundary value signals S1 and S2 are selected.

The selection circuit 35 sequentially delivers output signals SS1 and SS2 indicative of the presence or absence of an inversion at the boundary in the signal 300, in timed relationship with the shift clock 301. These output signals SS1 and SS2 are inputted to a register 36 and decoded in timed relationship with an inverted clock of the shift clock 301 and an output signal SD2 of the frequency divider 31 so as to be delivered out as decoded signals F1 and F2. The relation between the decoded signals F1 and F2 and the differential Manchester code is indicated in the following table 1.

TABLE 1

|   | F1 | F2 |
|---|----|----|
| J | 1  | 1  |
| K | 0  | 1  |
| 1 | 1  | 0  |
| 0 | 0  | 0  |

When the decoded signal F2 becomes logical value "0", indicating that as will be seen from Table 1, a symbol "1" or "0" of the differential Manchester code has been detected, a logical value "1" is inputted to a reset terminal R of the flip-flop 336 via an inverter 337 and an AND gate 335 included in the (K+1) detection inhibition circuit 33. As a result, the flip-flop 336 is reset to produce from its output terminal $\bar{Q}$ the logical value "1" which in turn is applied to the AND gate 331, permitting detection of an ensuring symbol J as shown at a time $t_5$ in the example of FIG. 2.

In the foregoing embodiment, the J symbol detection circuit 32 has four exclusive OR gates 321 to 324 but it may be constituted with one or two exclusive OR circuits whose output signals are delayed by using flip-flops, for example.

As described above, according to the invention, the input signal of signal elements in the form of the differential Manchester code can be decoded by detecting the symbol "J" from the input signal and thereafter inhibiting the detection of the symbol "K+1" until the symbol "0" or "1" is detected, thereby assuring realization of a decoding circuit which is advantageous in the following points:

(1) Being independent of the upper protocol;

(2) Reduction of processing delay time through the decoding circuit down to several signal elements; and (3) Reduction in the amount of hardwave required.

We claim:

1. A decoding circuit for a differential Manchester code for consisting of four symbols "J", "K", "1" and "0" each composed of two signal elements, said decoding circuit comprising:

first means responsive to a sequence of input signal elements of the differential Manchester code for detecting whether an inversion occurs at the boundary between the signal elements so as to produce first, second and third boundary signals concerning consecutive boundaries of three out of four consecutive signal elements and to detect that boundary signals concerning consecutive boundaries of four out of five consecutive signal elements are represented by "inverted, non-inverted, non-inverted, inverted" indicative of a symbol "J", and for delivering out a "J" detection signal;

second means responsive to the "J" detection signal produced from said first means for inhibiting the delivery of the "J" detection signal from said first means until a predetermined symbol detected; and third means responsive to the "J" detection signal produced from said first means for eliminating either the first boundary signal or the third boundary signal from the first to third boundary signals produced from said first means in timed relationship with the detecting of the symbol "J" and for delivering the remaining two boundary signals as decoded signals.

2. A decoding circuit according to claim 1, wherein said first means comprises:

means for sequentially receiving and holding a sequence of five input signal elements of the differential Manchester code;

means for detecting whether inversions occur at the boundaries of four out of five signal elements to produce four boundary signals;

means for producing three of the four boundary signals as the first to third boundary signals; and means for detecting that the four boundary signals are represented by "inverted, non-inverted, non-inverted, inverted" indicative of the svmbol "J", to produce the J detection signal.

3. A decoding circuit according to claim 1, wherein said first means receives the signal elements in timed relationship with a shift clock two cycles of which are allotted to one svmbol.

4. A decoding circuit according to claim 1, wherein said third means comprises:

means responsive to the shift clock for the signal elements for generating a ½ frequency clock of the shift clock; and means for eliminating either the first boundary signal or the third boundary signal from the first to third boundary signals in accordance with either coincidence or non-coincidence of the ½ frequency clock with the "J" detection signal produced from said first means and delivering out the two boundary signals.

5. A decoding circuit according to claim 1, wherein said predetermined signal is a symbol "0" or a symbol "1".

* * * * *